(12) United States Patent
Marty et al.

(10) Patent No.: US 9,219,095 B2
(45) Date of Patent: Dec. 22, 2015

(54) METHOD FOR PRODUCING AN OPTICAL FILTER IN AN INTEGRATED CIRCUIT, AND CORRESPONDING INTEGRATED CIRCUIT

(71) Applicants: STMicroelectronics SA, Montrouge (FR); STMicroelectronics (Crolles 2) SAS, Crolles (FR); Commissariat A L'Energie Atomique et aux Energies Alternatives, Paris (FR)

(72) Inventors: Michel Marty, Sain Paul D Varces (FR); Sebastien Jouan, Crolles (FR); Laurent Frey, Grenoble (FR)

(73) Assignees: STMicroelectronics SA, Montrouge (FR); STMicroelectronics (Crolles 2) SAS, Crolles (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/489,698

(22) Filed: Sep. 18, 2014

(65) Prior Publication Data

US 2015/0076573 A1    Mar. 19, 2015

(30) Foreign Application Priority Data

Sep. 19, 2013    (FR) ..................... 13 59026

(51) Int. Cl.
*H01L 27/146*    (2006.01)
*H01L 29/49*    (2006.01)
*H01L 31/107*    (2006.01)

(52) U.S. Cl.
CPC .... *H01L 27/14645* (2013.01); *H01L 27/14614* (2013.01); *H01L 27/14621* (2013.01); *H01L 27/14636* (2013.01); *H01L 27/14649* (2013.01); *H01L 27/14685* (2013.01); *H01L 27/14689* (2013.01); *H01L 29/4916* (2013.01); *H01L 31/107* (2013.01)

(58) Field of Classification Search
CPC ................ H01L 27/144; H01L 27/146; H01L 27/14649; H01L 27/14645; H01L 29/4916; H01L 31/0224; H01L 31/022433; H01L 31/107; H01L 31/113
USPC ........................................................ 257/292
See application file for complete search history.

(56) References Cited

U.S. PATENT DOCUMENTS

| 2007/0181246 A1* | 8/2007 | Yamashita et al. ............. 156/235 |
| 2009/0190759 A1* | 7/2009 | Peev et al. ..................... 380/256 |

(Continued)

OTHER PUBLICATIONS

INPI Search Report and Written Opinion for FR 1359026 dated May 21, 2014 (7 pages).

*Primary Examiner* — Nathan Ha
(74) *Attorney, Agent, or Firm* — Gardere Wynne Sewell LLP

(57) ABSTRACT

An integrated circuit includes a substrate and an interconnect part above the substrate, and further includes a photosensitive region in the substrate. A filter is provided aligned with the photosensitive region. The filter is formed by at least one layer of filter material. In one implementation for front side illumination, the layer of filter material is positioned above the photosensitive region between the interconnect part and the substrate. In another implementation for back side illumination, the layer of filter material is positioned below the photosensitive region opposite the interconnect part. The layer of filter material is configured such that a product of the thickness of the layer of filter material and the imaginary part of the refractive index of the layer of filter material is above 1 nm.

23 Claims, 5 Drawing Sheets

(56) References Cited

U.S. PATENT DOCUMENTS

| | | | |
|---|---|---|---|
| 2009/0200710 A1* | 8/2009 | Khusnatdinov et al. | 264/496 |
| 2009/0283807 A1* | 11/2009 | Adkisson et al. | 257/292 |
| 2009/0298220 A1 | 12/2009 | Anderson et al. | |
| 2010/0253616 A1* | 10/2010 | Omi et al. | 345/102 |
| 2011/0222062 A1* | 9/2011 | Martini et al. | 356/417 |
| 2011/0275538 A1* | 11/2011 | Sonkusale | 506/10 |
| 2012/0267694 A1 | 10/2012 | Kaiser et al. | |
| 2013/0009194 A1* | 1/2013 | Yamazaki et al. | 257/99 |
| 2013/0037728 A1* | 2/2013 | Kiesel et al. | 250/459.1 |
| 2013/0279849 A1* | 10/2013 | Santori et al. | 385/30 |
| 2013/0336349 A1* | 12/2013 | Watanabe et al. | 372/45.013 |
| 2014/0001588 A1* | 1/2014 | Sun et al. | 257/432 |

* cited by examiner

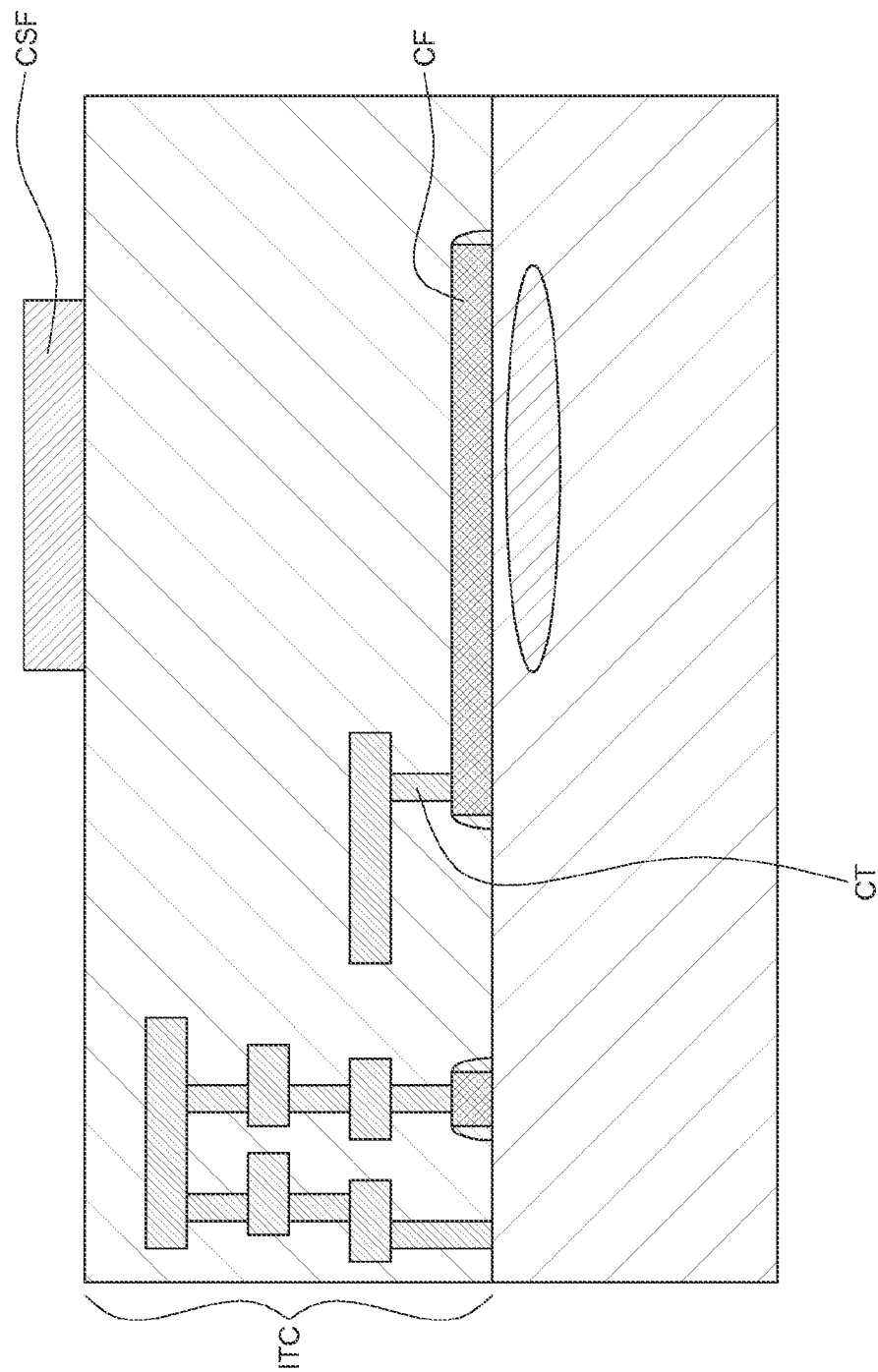

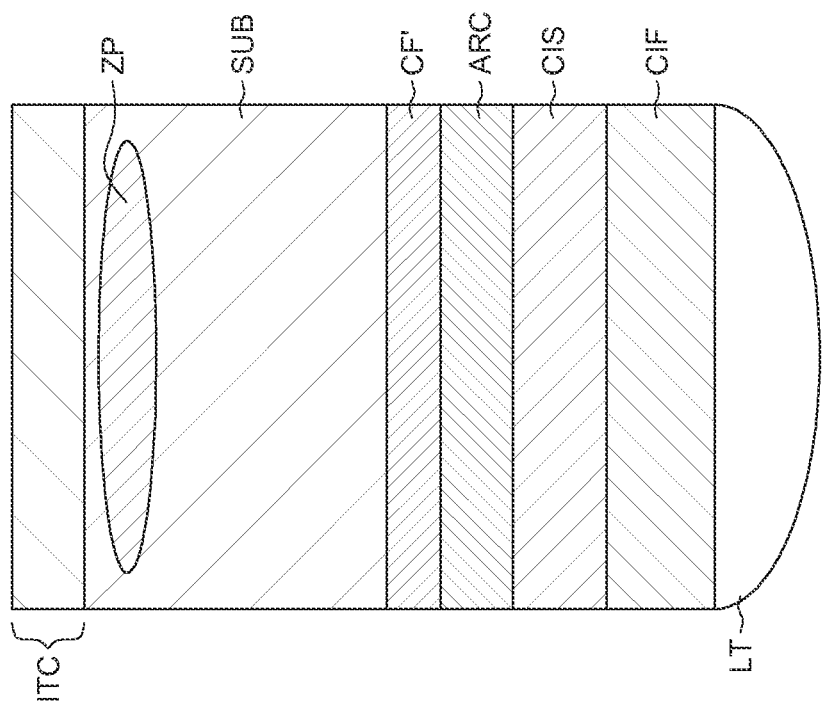

METHOD FOR PRODUCING AN OPTICAL FILTER IN AN INTEGRATED CIRCUIT, AND CORRESPONDING INTEGRATED CIRCUIT

PRIORITY CLAIM

This application claims priority from French Application for Patent No. 1359026 filed Sep. 19, 2013, the disclosure of which is incorporated by reference.

TECHNICAL FIELD

The invention relates to integrated circuits and particularly those of an imager type which comprise photosensitive regions.

BACKGROUND

The photosensitive regions of integrated circuits of an imager type can be regions of substrates of photodiodes, particularly SPADs (single photon avalanche diodes.)

This type of photodiode is notably used for detecting photons with a wavelength situated in the infrared (around 850 nm). This being the case, the quantum efficiency of these photodiodes is low for these wavelengths, whereas it is high for wavelengths in the visible domain. The signal-to-noise ratio of these photodiodes can therefore be poor.

It has therefore been proposed to use filters to reduce the detection of radiation in the visible domain which can be considered as noise for the operation of single photon avalanche diodes. This being the case, these filters are not always sufficiently effective.

SUMMARY

According to a mode of execution and embodiment, a method is proposed for producing an optical filter in an integrated circuit, and an integrated circuit comprising an optical filter, which improve the signal-to-noise ratio in the photosensitive regions situated in substrates, in particular the photosensitive regions of single photon avalanche diodes.

According to one aspect, a method is proposed for producing an optical filter intended to filter radiation in an integrated circuit including a substrate and an interconnect part above the substrate.

In general, the production of the filter comprises the formation of at least one layer of filter above a photosensitive region situated in the substrate and between the substrate and the interconnect part, or below the photosensitive region and on the opposite side from the interconnect part, the product of the thickness of the layer of filter and the imaginary part of the refractive index of the layer of filter being above 1 nanometer for the wavelengths of the radiation to be filtered.

The term "filter" refers to a reduction in the passage of radiation which is therefore blocked. By way of example, it may be desirable to filter the radiation corresponding to the visible domain to detect infrared radiation.

It has been observed that it is possible to arrange a layer of filter having certain optical properties (in particular a product of the imaginary part of its refractive index and its thickness, which has a high value) directly above the photosensitive region of the substrate, before the formation of the interconnect part, or on the back of the substrate, for example for a back-side illumination imager.

It is therefore possible to block some radiation, especially radiation in the visible domain, when detection of infrared radiation is desired.

Preferably, the product of the thickness of the layer of filter and the imaginary part of the refractive index can be above 10 nanometers for the wavelengths of the radiation to be filtered.

It is possible to form an electrically conductive layer of filter configured to be polarized.

For certain applications, it is particularly beneficial to obtain a conductive layer of a filter, to be able to polarize this layer of the filter and to improve the electrical behavior of the detection device that comprises the photosensitive region. It will therefore be possible to improve the diffusion of the electrons in the substrate.

It is possible to connect the filter layer to the interconnect part by at least one contact.

The formation of said at least one layer of filter can comprise the formation of a layer containing polycrystalline silicon or else amorphous silicon.

The formation of said at least one layer of filter can comprise the formation of a layer containing polycrystalline silicon and p-type doping of the layer.

Polycrystalline silicon, with a sufficient height (for example 180 nm) and having p-type doping, has satisfactory optical properties, and can be polarized.

The formation of said at least one layer is carried out simultaneously and at the same level as the formation of a gate region of a transistor of the integrated circuit, the layer of filter being produced above the photosensitive region and between the substrate and the interconnect part.

Integrated circuits generally comprise transistors equipped with gate regions of doped polycrystalline silicon; it is therefore possible to form the layer of filter and these gate regions simultaneously. According to one aspect, it is possible to obtain a layer of filter without any additional fabrication step, but simply by modifying the patterns of the photolithographic masks used.

The formation of the photosensitive region can comprise the formation of a single photon avalanche diode.

The production of the filter can furthermore comprise the formation of an additional layer of filter situated above or inside the interconnect part if the layer of filter is produced above the photosensitive region and between the substrate and the interconnect part, or produced below the layer of filter if the layer of filter is produced below the photosensitive region and on the opposite side from the interconnect part.

Indeed, a filter of the prior art can also be used to complete the filtering.

According to another aspect, a method is proposed for realizing an integrated circuit comprising forming within said integrated circuit an optical filter according to the method defined above.

According to another aspect, an integrated circuit is proposed including a substrate, an interconnect part above the substrate and an optical filter intended to filter radiation.

In general, the optical filter comprises at least one layer of filter situated above a photosensitive region situated in the substrate and between the substrate and the interconnect part, or situated below the photosensitive region and on the opposite side from the interconnect part, the product of the thickness of the layer of filter and the imaginary part of the refractive index of the layer of filter being above 1 nanometer for the wavelengths of the radiation to be filtered.

To filter a wavelength in the order of 500 nanometers (visible radiation), it is possible to use a layer of polycrystalline silicon having a thickness of 180 nanometers and a value of the imaginary part of the refractive index equal to 0.14. The product of the thickness and of the imaginary part is then equal to 25 nanometers, which makes it possible to reduce the luminous intensity at 500 nanometers by around 46%.

The product of the thickness of the layer of filter and the imaginary part of the refractive index can be above 10 nanometers for the wavelengths of the radiation to be filtered.

The layer of filter can be electrically conductive.

The layer of filter can contain polycrystalline silicon or amorphous silicon.

The layer of filter can contain polycrystalline silicon having p-type doping.

The integrated circuit can furthermore comprise at least one transistor, the gate region of which comprises polycrystalline silicon having p-type doping and the same thickness as the layer of filter, the layer of filter and the gate region being situated at the same level, the layer of filter being situated above the photosensitive region and between the substrate and the interconnect part.

The photosensitive region can be a photosensitive region of a single photon avalanche diode.

The integrated circuit can furthermore comprise an additional layer of filter situated above or inside the interconnect part if the layer of filter is situated above the photosensitive region and between the substrate and the interconnect part, or situated below the layer of filter if the layer of filter is situated below the photosensitive region and on the opposite side from the interconnect part.

BRIEF DESCRIPTION OF THE DRAWINGS

Other advantages and characterizing features of the invention will become apparent upon studying the detailed description of modes of execution and embodiment, given by way of non-limiting example and illustrated by the appended drawings in which:

FIGS. 1 to 5 illustrate various steps of a mode of execution of a method.

DETAILED DESCRIPTION OF THE DRAWINGS

Figure 1:
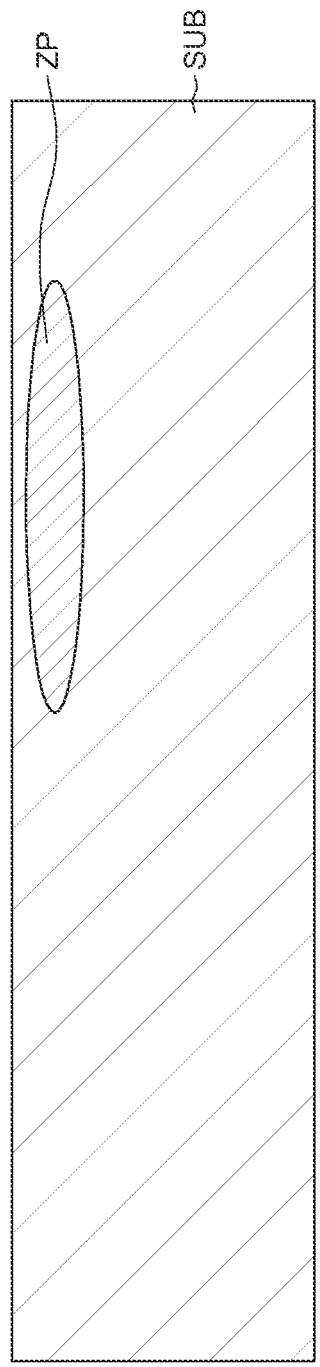
Figure 2:
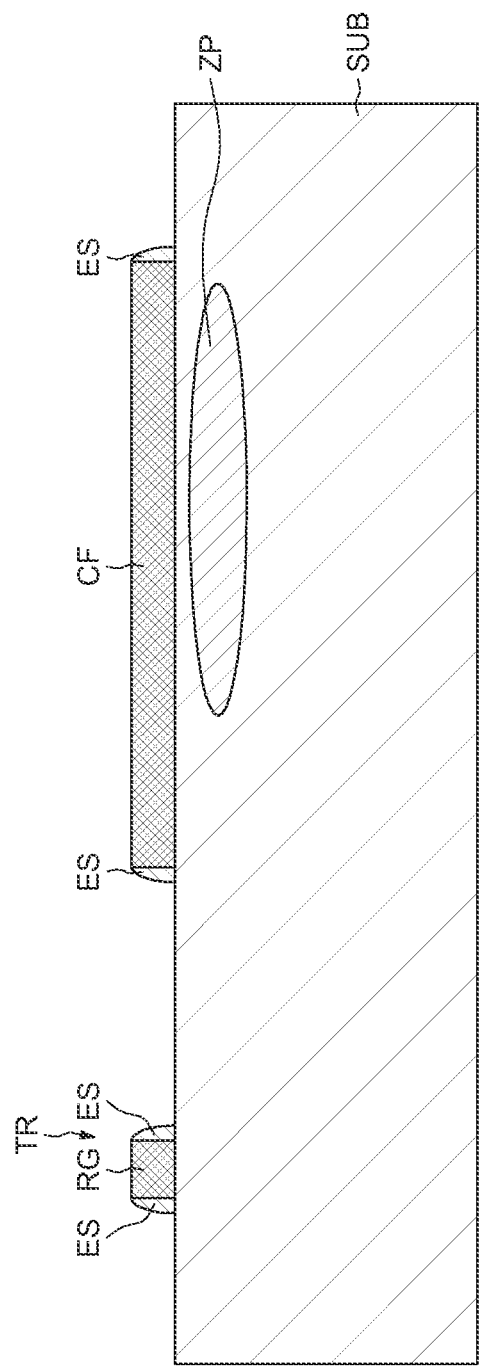

FIG. 1 shows a substrate SUB, for example made of silicon, in which a photosensitive region ZP has already been formed.

The photosensitive region ZP can be part of a single photon avalanche diode, or else of a photodiode referred to as a pinned diode.

For information purposes, the photosensitive region ZP can be intended to detect photons having a wavelength situated in the infrared, and it is therefore preferable to block radiation from the visible domain so that it does not reach this photosensitive region.

It should be noted that the region ZP is a photosensitive region of a so-called "front-side" imager. In a variant, it is possible to implement the invention inside a back-side illumination imager.

To block this radiation, a layer of a filter CF can be formed above the photosensitive region ZP.

This layer of filter CF can be a layer of polycrystalline silicon having p-type doping. Simultaneously, it is also possible to have a gate region RG of a transistor TR formed on the substrate SUB. By virtue of this fact, the formation of the layer of filter can comprise the same steps as the formation of a transistor gate. Generally, transistor gates have thicknesses in the order of 180 nm, and this thickness makes it possible to obtain a layer of filter suitable for filtering the visible domain radiation. The product of the thickness of the layer of filter and the imaginary part of the refractive index of this layer of filter is here above 1 nanometer or even above 10 nanometers for the wavelengths of the radiation to be blocked, which corresponds to a good absorption.

By way of example, for a thickness of polycrystalline silicon of 180 nanometers (with an imaginary part of the refractive index equal to 0.054 for the wavelength of 600 nm), there is a product (visible domain to be filtered) in the order of 9.7 nanometers, which corresponds to an attenuation of the luminous intensity at 600 nanometers received in the order of around 18%. A same layer of polycrystalline silicon has, in the neighborhood of a wavelength of 850 nanometers to be let through, a product in the order of 0.7 nanometers (with an imaginary part of the refractive index equal to 0.004), which corresponds to a very low attenuation of around 1%.

For a layer of amorphous silicon having a thickness equal to 180 nanometers (imaginary part of the refractive index equal to 0.5), there is a product at 500 nanometers equal to 90 nanometers, which corresponds to an attenuation of around 90%.

It can be noted that spacers ES are formed on either side of the gate region RG and also in the neighborhood of the edges of the layer of filter CF.

Figure 3:
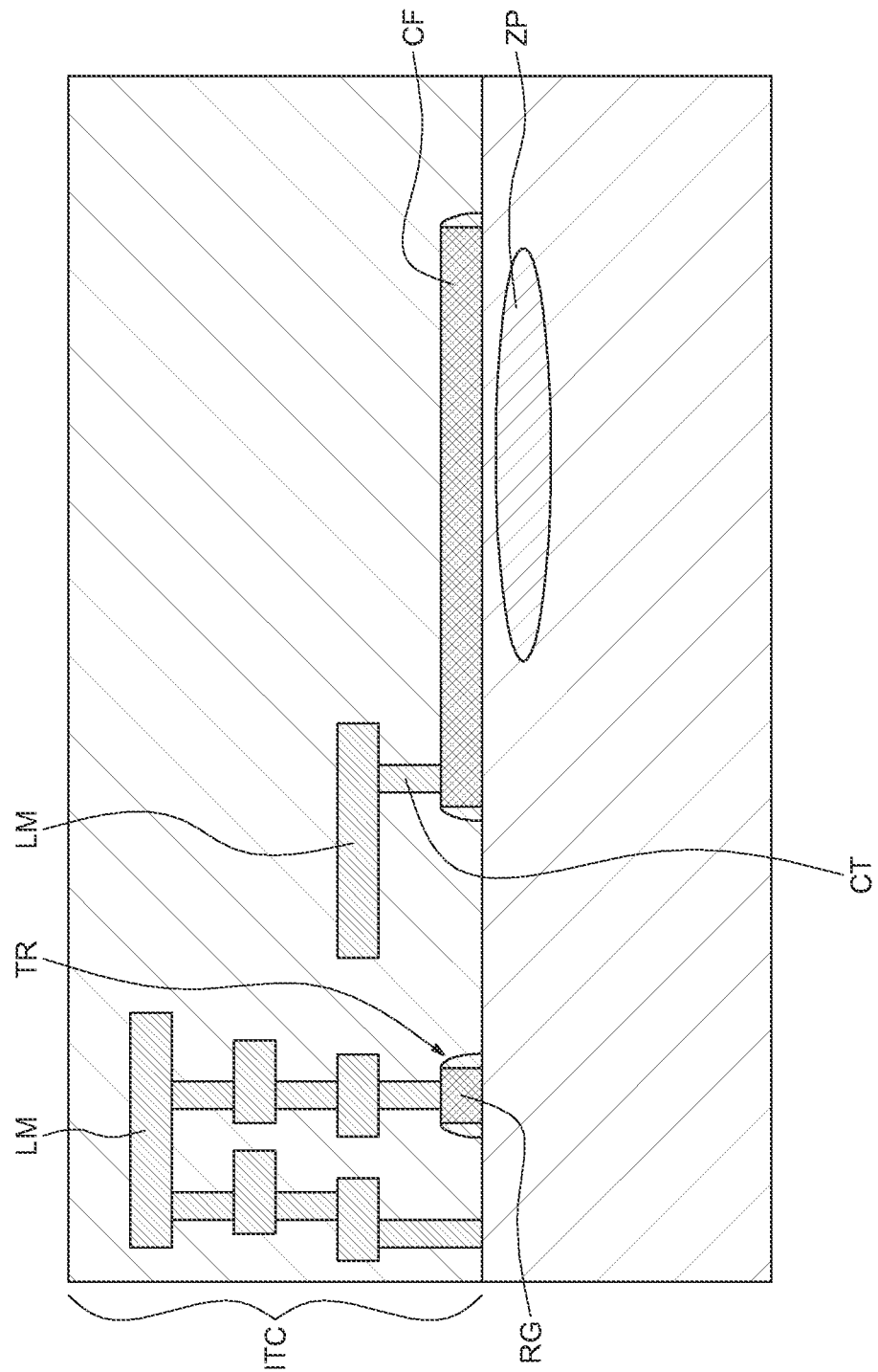

It is then possible to form an interconnect region ITC above the substrate on which the layer of filter CF and the transistor TR have been formed, as illustrated in FIG. 3.

The interconnect region ITC (commonly denoted by those skilled in the art by the acronym BEOL (back end of line)) comprises a plurality of metal lines LM, but it is preferable that no metal line LM extends above the photosensitive region ZP.

The layer of filter CF extends laterally beyond the photosensitive region ZP, and an electrical contact CT has been formed to connect this layer of filter to the interconnect network ITC. With the contact CT, it is possible to polarize the layer of filter CF and thus to obtain an improved functionality for the photosensitive region ZP.

As a matter of fact, by polarizing the filter layer CF by an electrical contact, an electrical field is generated which generates a hole accumulation zone under the crystalline silicon interface. Thus, surface defects are overcome which permits a decrease in the dark current rate (DCR) of a SPAD type sensor or the dark current of an imaging device without degrading the quantum efficiency (QE) of the pixels.

Although it is not obligatory, the layer of filter CF can be completed by an additional layer of filter CSF situated above or inside the interconnect part ITC, as illustrated in FIG. 4.

The additional layer of filter CSF can be a stack of multilayer optical filters, or else a layer of resin. This multilayer optical filter can be a multilayer optical filter comprising layers of metal and layers of dielectric material. For information purposes, to transmit a wavelength of 850 nanometers and block radiation in the visible domain, it is possible to use an additional layer of filter including two layers of copper having a thickness of around 25 nanometers separated by a layer of silicon nitride having a thickness of around 180 nanometers. It is also possible to form silicon nitride layers around the copper layers to improve the adhesion of the copper layers and to protect them.

FIG. 5 shows a variant of the invention in which a layer of filter CF' is produced below a photosensitive region ZP of a substrate SUB and on the opposite side from the interconnect part ITC. A back-side illumination imager is thus obtained.

As illustrated in FIG. 5, the layer of filter CF' is produced under the substrate SUB. It is also possible to form, under the layer of filter CF', an anti-reflective layer ARC for example made of silicon nitride, an insulating layer CIS for example made of silicon dioxide and an additional under-layer of filter CIF, for example a multilayer optical filter. Finally, an optical lens can be produced under the additional under-layer of filter.

Thus, with the layer CF', a good attenuation of the radiation to be filtered is obtained. The layer CF' can be made of polycrystalline silicon or preferably of amorphous silicon.

According to one aspect, better operation of integrated circuits comprising photosensitive regions, i.e. integrated imager circuits, is obtained.

According to one aspect, additional filtering is obtained that does not require any additional fabrication step, and that can improve electron diffusion in the underlying substrate.

According to yet another aspect, it is possible to filter radiation for back-side illumination imagers.

What is claimed is:

1. An integrated circuit, comprising:
a substrate having a photosensitive region,
an interconnect part above the substrate, and
an optical filter configured to filter radiation, wherein the optical filter comprises: at least one layer of filter material made of an electrically conductive material, aligned with the photosensitive region situated in the substrate and extending laterally beyond the photosensitive region, said at least one layer of filter material being electrically connected to an electrical contact at a portion of the electrically conductive material located laterally beyond the photosensitive region, so as to generate, in the electrically conductive material of the optical filter, an electrical field that polarizes the at least one layer of filter material.

2. The integrated circuit of claim 1, wherein the at least one layer of filter material is formed on a surface between the substrate and the interconnect part.

3. The integrated circuit of claim 1, wherein the at least one layer of filter material is formed on a surface below the photosensitive region and opposite from the interconnect part.

4. The integrated circuit according to claim 1, wherein a product of the thickness of the at least one layer of filter material and the imaginary part of the refractive index is above 10 nanometers for the wavelengths of the radiation to be filtered.

5. The integrated circuit according to claim 1, wherein a product of the thickness of the at least one layer of filter material and the imaginary part of the refractive index is above 1 nanometer for the wavelengths of the radiation to be filtered.

6. The integrated circuit according to claim 1, wherein the electrically conductive material for the at least one layer of filter material comprises one of polycrystalline silicon or amorphous silicon.

7. The integrated circuit according to claim 1, wherein the electrically conductive material for the at least one layer of filter material comprises polycrystalline silicon having p-type doping.

8. The integrated circuit according to claim 7, further comprising at least one transistor having a gate region which comprises polycrystalline silicon having p-type doping and having a same thickness as the layer of filter material.

9. The integrated circuit according to claim 1, wherein the photosensitive region is a photosensitive region of a single photon avalanche diode.

10. The integrated circuit according to claim 1, further comprising an additional layer of filter material situated above or inside the interconnect part.

11. The integrated circuit of claim 1, wherein the electrical contact connects to a metal line controlling the polarization of the at least one layer of filter material.

12. An integrated circuit, comprising:
a substrate having a front side and a back side and including a photosensitive region;
an interconnect part above the front side of the substrate;
an optical filter comprising:
an electrically conductive material layer positioned in alignment with the photosensitive region and extending laterally beyond the photosensitive region, the electrically conductive material layer being electrically connected to an electrical contact at a portion of the optical filter located laterally beyond the photosensitive region, so as to generate, in the electrically conductive material layer of the optical filter, an electrical field that polarizes the electrically conductive material layer.

13. The integrated circuit of claim 12, wherein the optical filter comprises a layer of filter material positioned between the front side of the substrate between the substrate and the interconnect part.

14. The integrated circuit of claim 13, wherein the optical filter comprises a layer of filter material mounted to the back side of the substrate.

15. The integrated circuit of claim 14, wherein a product of the thickness of the layer of filter material and the imaginary part of the refractive index is above 10 nanometers for a certain wavelength range to be filtered.

16. The integrated circuit of claim 14, wherein a product of the thickness of the layer of filter material and the imaginary part of the refractive index is above 1 nanometer for a certain wavelength range to be filtered.

17. The integrated circuit of claim 14, wherein said electrically conductive material layer comprises a layer of material selected from the group consisting of polycrystalline silicon and amorphous silicon.

18. The integrated circuit of claim 14, wherein said electrically conductive material layer comprises a layer of polycrystalline silicon doped with p-type dopant.

19. The integrated circuit of claim 14, wherein said electrically conductive material layer comprises a layer of filter material located at a same level as a gate region of a transistor of the integrated circuit.

20. The integrated circuit of claim 14, wherein the photosensitive region comprises a single photon avalanche diode.

21. The integrated circuit of claim 14, further comprising a layer of filter material situated above or inside the interconnect part.

22. The integrated circuit of claim 14, wherein the optical filter comprises a plurality of filter layers.

23. The integrated circuit according to claim 14, wherein the electrical contact connects to a metal line controlling the polarization of the at least one layer of filter material.

* * * * *